(12) United States Patent　(10) Patent No.: US 9,006,828 B2
Saito et al.　(45) Date of Patent: Apr. 14, 2015

(54) DISPLAY DEVICE AND SEMICONDUCTOR DEVICE

(71) Applicant: Kabushiki Kaisha Toshiba, Minato-ku (JP)

(72) Inventors: Nobuyoshi Saito, Ota (JP); Tomomasa Ueda, Yokohama (JP); Yuya Maeda, Kawasaki (JP); Kentaro Miura, Kawasaki (JP); Shintaro Nakano, Kawasaki (JP); Tatsunori Sakano, Kawasaki (JP); Hajime Yamaguchi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/453,702

(22) Filed: Aug. 7, 2014

(65) Prior Publication Data

US 2015/0076471 A1　Mar. 19, 2015

(30) Foreign Application Priority Data

Sep. 19, 2013　(JP) .................................. 2013-194633

(51) Int. Cl.
*H01L 27/12*　(2006.01)
*H01L 27/32*　(2006.01)
*H01L 29/423*　(2006.01)
*H01L 29/786*　(2006.01)

(52) U.S. Cl.
CPC ...... *H01L 27/3262* (2013.01); *H01L 29/42368* (2013.01); *H01L 29/42384* (2013.01); *H01L 29/7869* (2013.01); *H01L 2029/42388* (2013.01)

(58) Field of Classification Search
CPC ..... H01L 21/336; H01L 27/12; H01L 29/772; H01L 29/66969; H01L 29/7869; H01L 29/66068; H01L 29/42834; H01L 29/045–29/051
USPC ................. 257/347, E27.112, 29.254, 21.409
See application file for complete search history.

(56) References Cited

U.S. PATENT DOCUMENTS

| 2003/0047785 A1 | 3/2003 | Kawasaki et al. |
| 2004/0195568 A1 | 10/2004 | Okumura |
| 2008/0203441 A1* | 8/2008 | Endo ............................ 257/255 |
| 2011/0284959 A1* | 11/2011 | Kimura et al. ................ 257/347 |

FOREIGN PATENT DOCUMENTS

| JP | 2003-86808 | 3/2003 |
| JP | 2004-103957 | 4/2004 |
| JP | 2004-253596 | 9/2004 |
| JP | 2005-70629 | 3/2005 |
| JP | 2009-224479 | 10/2009 |

* cited by examiner

*Primary Examiner* — Michael Lebentritt
(74) *Attorney, Agent, or Firm* — Oblon, McClelland, Maier & Neustadt, L.L.P.

(57) ABSTRACT

A display device includes a first electrode, a second electrode, an organic light emitting layer, a first transistor, and a second transistor. The first transistor includes a first semiconductor layer, a first conductive unit, a second conductive unit, a first gate electrode, and a first gate insulating film. The second transistor includes a second semiconductor layer, a third conductive unit, a fourth conductive unit, a second gate electrode, and a second gate insulating film. An amount of hydrogen included in the first gate insulating film is larger than an amount of hydrogen included in the second gate insulating film.

20 Claims, 9 Drawing Sheets

DISPLAY DEVICE AND SEMICONDUCTOR DEVICE

CROSS-REFERENCE TO RELATED APPLICATIONS

This application is based upon and claims the benefit of priority from Japanese Patent Application No. 2013-194633, filed on Sep. 19, 2013; the entire contents of which are incorporated herein by reference.

FIELD

Embodiments described herein relate generally to a display device and a semiconductor device.

BACKGROUND

There is known an active matrix display device in which the current flowing in the organic EL (electroluminescence) element is controlled by a thin film transistor. Furthermore, there is known a semiconductor device used in the display device. Improvement in reliability is desired in such display devices and semiconductor devices.

DETAILED DESCRIPTION

Figure 1:
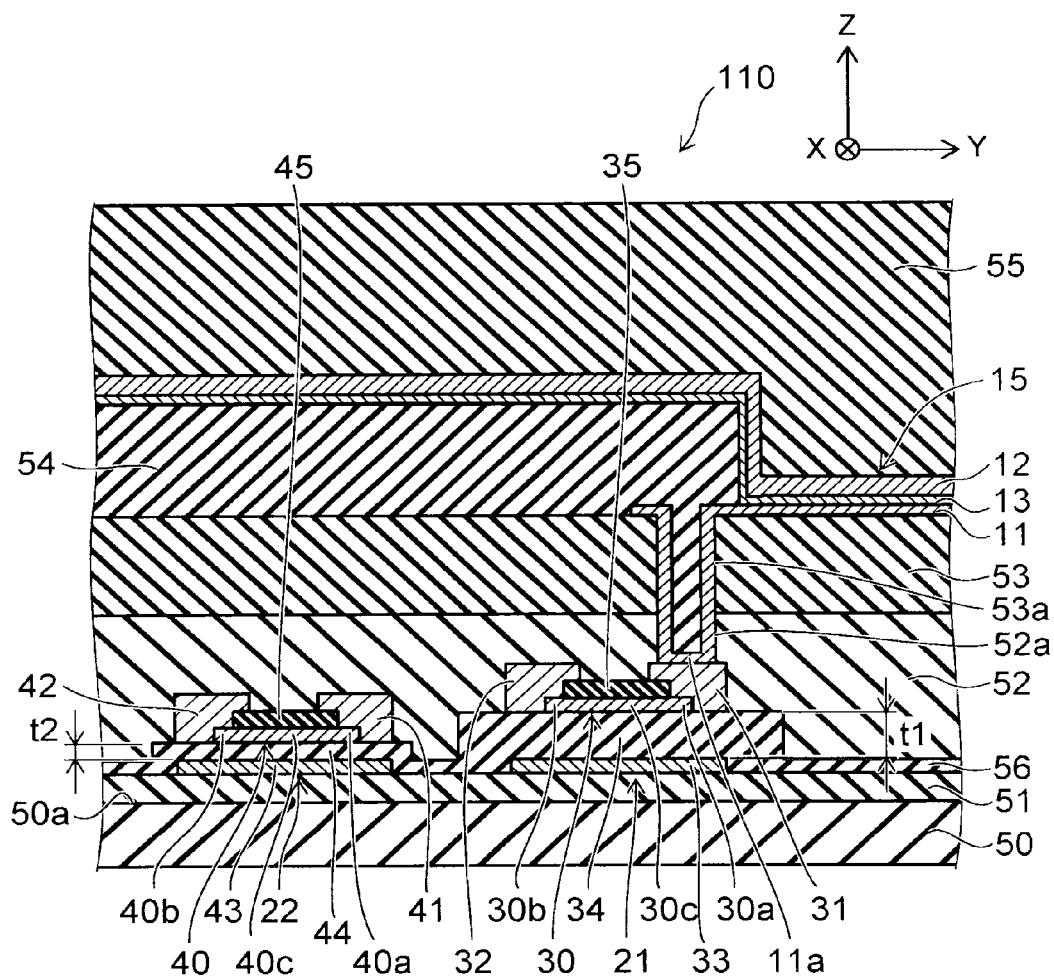
FIG. 1 is a sectional view schematically showing a display device according to a first embodiment.

According to one embodiment, a display device includes a first electrode, a second electrode, an organic light emitting layer, a first transistor, and a second transistor. The first electrode is optical transparency. The second electrode opposes the first electrode. The organic light emitting layer is provided between the first electrode and the second electrode. The first transistor includes a first semiconductor layer, a first conductive unit, a second conductive unit, a first gate electrode, and a first gate insulating film. The first semiconductor layer includes a first portion, a second portion, and a third portion provided between the first portion and the second portion. The first conductive unit is electrically connected to one of the first electrode and the second electrode and is electrically connected to the first portion. The second conductive unit is separated from the first conductive unit and is electrically connected to the second portion. The first gate electrode is separated from the first conductive unit and the second conductive unit and opposes the third portion. The first gate insulating film is provided between the third portion and the first gate electrode. The second transistor includes a second semiconductor layer, a third conductive unit, a fourth conductive unit, a second gate electrode, and a second gate insulating film. The second semiconductor layer includes a fourth portion, a fifth portion, and a sixth portion provided between the fourth portion and the fifth portion. The third conductive unit is electrically connected to one of the first conductive unit, the second conductive unit, and the first gate electrode and is electrically connected to the fourth portion. The fourth conductive unit is separated from the third conductive unit and is electrically connected to the fifth portion. The second gate electrode is separated from the third conductive unit and the fourth conductive unit and opposes the sixth portion. The second gate insulating film is provided between the sixth portion and the second gate electrode. An amount of hydrogen included in the first gate insulating film is larger than an amount of hydrogen included in the second gate insulating film.

According to another embodiment, a semiconductor device includes a first transistor and a second transistor. The first transistor includes a first semiconductor layer, a first conductive unit, a second conductive unit, a first gate electrode, and a first gate insulating film. The first semiconductor layer includes a first portion, a second portion, and a third portion provided between the first portion and the second portion. The first conductive unit is electrically connected to the first portion. The second conductive unit is separated from the first conductive unit and is electrically connected to the second portion. The first gate electrode is separated from the first conductive unit and the second conductive unit and opposes the third portion. The first gate insulating film is provided between the third portion and the first gate electrode. The second transistor includes a second semiconductor layer, a third conductive unit, a fourth conductive unit, a second gate electrode, and a second gate insulating film. The second semiconductor layer includes a fourth portion, a fifth portion, and a sixth portion provided between the fourth portion and the fifth portion. The third conductive unit is electrically connected to one of the first conductive unit, the second conductive unit, and the first gate electrode and is electrically connected to the fourth portion. The fourth conductive unit is separated from the third conductive unit and is electrically connected to the fifth portion. The second gate electrode is separated from the third conductive unit and the fourth conductive unit and opposes the sixth portion. The second gate insulating film is provided between the sixth portion and the second gate electrode. An amount of hydrogen included in the first gate insulating film is larger than an amount of hydrogen included in the second gate insulating film.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present description and the drawings, components similar to those described previously with reference to earlier figures are labeled with like reference numerals, and the detailed description thereof is omitted appropriately.

First Embodiment

FIG. 1 is a sectional view schematically showing a display device according to a first embodiment.

As shown in FIG. 1, the display device 110 includes a first electrode 11, a second electrode 12, an organic light emitting layer 13, a first transistor 21, and a second transistor 22.

The first electrode 11 has optical transmissivity. The second electrode 12 opposes the first electrode 11. In this example, the second electrode 12 is optically reflective. The optical reflectance of the second electrode 12 is higher than the optical reflectance of the first electrode 11. The second electrode 12 may be optical transparency. For instance, the first electrode 11 is an anode, and the second electrode 12 is a cathode. Alternatively, the first electrode 11 may be a cathode, and the second electrode 12 may be an anode. The first electrode 11 may be referred to as e.g. a pixel electrode.

The organic light emitting layer 13 is provided between the first electrode 11 and the second electrode 12. The organic light emitting layer 13 is electrically connected to the first electrode 11 and the second electrode 12. The organic light emitting layer 13 is e.g. in contact with at least part of the first electrode 11 and in contact with at least part of the second electrode 12.

The first electrode 11, the second electrode 12, and the organic light emitting layer 13 constitute a light emitting element part 15 of the organic EL type. More specifically, the respective portions of the organic light emitting layer 13 electrically connected to the first electrode 11 and the second electrode 12 constitute a light emitting element part 15. A current is passed between the first electrode 11 and the second electrode 12. Thus, light is emitted from the organic light emitting layer 13. The light emitted from the organic light emitting layer 13 is transmitted through the first electrode 11.

Light emission of the light emitting element part 15 is driven by the first transistor 21 and the second transistor 22. In the display device 110, a plurality of light emitting element parts 15, a plurality of first transistors 21, and a plurality of second transistors 22 are combined and arranged in a matrix. Light emission of the plurality of light emitting element parts 15 is controlled by controlling the driving of the plurality of first transistors 21 and the plurality of second transistors 22. Thus, an image is displayed in the display device 110. The display device 110 is an active matrix display device based on organic EL.

Here, the direction parallel to the stacking direction of the first electrode 11, the second electrode 12, and the organic light emitting layer 13 is referred to as Z-axis direction. One direction perpendicular to the Z-axis direction is referred to as X-axis direction. The direction perpendicular to the X-axis direction and the Z-axis direction is referred to as Y-axis direction. The Z-axis direction is e.g. perpendicular to each film surface of the first electrode 11, the second electrode 12, and the organic light emitting layer 13. The Z-axis direction is synonymous with e.g. each thickness direction of the first electrode 11, the second electrode 12, and the organic light emitting layer 13.

The first transistor 21 includes a first semiconductor layer 30, a first conductive unit 31, a second conductive unit 32, a first gate electrode 33, and a first gate insulating film 34.

The first semiconductor layer 30 includes a first portion 30a, a second portion 30b, and a third portion 30c between the first portion 30a and the second portion 30b.

The first conductive unit 31 is electrically connected to one of the first electrode 11 and the second electrode 12, and electrically connected to the first portion 30a. In this example, the first conductive unit 31 is electrically connected to the first electrode 11. The second conductive unit 32 is separated from the first conductive unit 31 and electrically connected to the second portion 30b. For instance, one of the first conductive unit 31 and the second conductive unit 32 is a drain, and the other is a source.

The first gate electrode 33 is separated from the first conductive unit 31, the second conductive unit 32, and the first semiconductor layer 30. The first gate electrode 33 opposes the third portion 30c. The first gate electrode 33 opposes the third portion 30c in e.g. the Z-axis direction. The first gate insulating film 34 is provided between the third portion 30c and the first gate electrode 33.

The second transistor 22 includes a second semiconductor layer 40, a third conductive unit 41, a fourth conductive unit 42, a second gate electrode 43, and a second gate insulating film 44.

The second semiconductor layer 40 includes a fourth portion 40a, a fifth portion 40b, and a sixth portion 40c between the fourth portion 40a and the fifth portion 40b.

The third conductive unit 41 is electrically connected to the fourth portion 40a. Furthermore, the third conductive unit 41 is electrically connected to one of the first conductive unit 31, the second conductive unit 32, and the first gate electrode 33 through a wiring or the like, not shown. The fourth conductive unit 42 is separated from the third conductive unit 41 and electrically connected to the fifth portion 40b. For instance, one of the third conductive unit 41 and the fourth conductive unit 42 is a drain, and the other is a source.

The second gate electrode 43 is separated from the third conductive unit 41, the fourth conductive unit 42, and the second semiconductor layer 40. The second gate electrode 43 opposes the sixth portion 40c. The second gate electrode 43 opposes the sixth portion 40c in e.g. the Z-axis direction. The second gate insulating film 44 is provided between the sixth portion 40c and the second gate electrode 43.

The display device 110 further includes e.g. a substrate 50, a barrier layer 51, a protective layer 52, a planarization layer 53, a bank layer 54, and a sealing layer 55. Each of these parts is appropriately provided in the display device 110, and can be omitted.

The substrate 50 has a major surface 50a. The major surface 50a is e.g. a surface perpendicular to the Z-axis direction. The substrate 50 is made of e.g. a material having optical transmissivity. The substrate 50 is made of e.g. glass material or resin material. The substrate 50 further has e.g. flexibility. In this case, the substrate 50 is made of e.g. a flexible resin material such as polyimide.

The barrier layer 51 is provided on the major surface 50a. The barrier layer 51 suppresses e.g. penetration of moisture from the substrate 50 side. The barrier layer 51 is made of e.g. silicon oxide film, silicon nitride film, or silicon oxynitride film.

The first transistor 21 and the second transistor 22 are provided on the major surface 50a. In this example, the first transistor 21 and the second transistor 22 are provided on the barrier layer 51. For instance, the first transistor 21 and the second transistor 22 are juxtaposed on the barrier layer 51.

The first gate electrode 33 and the second gate electrode 43 are provided on the barrier layer 51. The first gate electrode 33 and the second gate electrode 43 are made of e.g. a high melting point metal such as molybdenum tungsten (MoW), molybdenum tantalum (MoTa), and tungsten (W). Alternatively, the material of the first gate electrode 33 and the second gate electrode 43 may be an Al alloy composed primarily of Al with countermeasures against hillocks, or Cu having lower resistance.

The first gate insulating film 34 is provided on the first gate electrode 33. The second gate insulating film 44 is provided on the second gate electrode 43. In this example, the second gate insulating film 44 is continuous with the first gate insulating film 34. The first gate insulating film 34 and the second gate insulating film 44 constitute e.g. a single continuous insulating layer 56. For instance, the insulating layer 56 is provided on the first gate electrode 33, on the second gate electrode 43, and on the barrier layer 51. The first gate insulating film 34 is e.g. part of the insulating layer 56. The second gate insulating film 44 is e.g. another part of the insulating layer 56. The insulating layer 56 has e.g. insulating property and optical transmissivity.

The first gate insulating film 34 may be separated from the second gate insulating film 44. The first gate insulating film 34 only needs to exist at least between the first semiconductor layer 30 and the first gate electrode 33. The second gate insulating film 44 only needs to exist at least between the second semiconductor layer 40 and the second gate electrode 43.

The first gate insulating film 34 and the second gate insulating film 44 (insulating layer 56) are made of at least one of e.g. silicon oxide film (e.g., $SiO_2$), silicon nitride film (e.g., $SiN_x$), and silicon oxynitride film (SiON). In this example, the material of the first gate insulating film 34 is substantially the same as the material of the second gate insulating film 44.

In this example, the thickness t1 of the first gate insulating film 34 is thicker than the thickness t2 of the second gate insulating film 44. The thickness t1 is, in other words, the length in the Z-axis direction of the first gate insulating film 34. The thickness t2 is, in other words, the length in the Z-axis direction of the second gate insulating film 44. The thickness t1 is e.g. 10 nm or more and 1000 nm or less. The thickness t2 is e.g. 5 nm or more and 500 nm or less.

In this example, the material of the first gate insulating film 34 is substantially the same as the material of the second gate insulating film 44. Thus, the concentration of hydrogen per unit volume of the first gate insulating film 34 is substantially equal to the concentration of hydrogen per unit volume of the second gate insulating film 44. On the other hand, the volume of the first gate insulating film 34 is larger than the volume of the second gate insulating film 44. Thus, the amount of hydrogen included in the first gate insulating film 34 is larger than the amount of hydrogen included in the second gate insulating film 44.

The first semiconductor layer 30 is provided on the first gate insulating film 34. The second semiconductor layer 40 is provided on the second gate insulating film 44. That is, in this example, the first transistor 21 and the second transistor 22 are of what is called the bottom gate type.

The first semiconductor layer 30 and the second semiconductor layer 40 include e.g. an oxide including at least one of gallium, zinc, tin, and silicon, and indium. That is, the first semiconductor layer 30 and the second semiconductor layer 40 are e.g. oxide films including In, Ga, and Zn (i.e., In—Ga—Zn—O oxide films). Alternatively, the first semiconductor layer 30 and the second semiconductor layer 40 may be oxide films including In and Zn (i.e., In—Zn—O oxide films). Alternatively, the first semiconductor layer 30 and the second semiconductor layer 40 may be oxide films including In, Zn, and Si (i.e., In—Zn—Si—O oxide films). In the following, the In—Ga—Zn—O oxide films are generically referred to as "InGaZnO film".

The material of the first semiconductor layer 30 may be the same as or different from the material of the second semiconductor layer 40. The first semiconductor layer 30 and the second semiconductor layer 40 have e.g. n-type conductivity or p-type conductivity. In the following, this example is described in the case where the first semiconductor layer 30 and the second semiconductor layer 40 are of n-type.

In this example, the first transistor 21 further includes a first channel protective film 35, and the second transistor 22 further includes a second channel protective film 45. The first channel protective film 35 is provided on the third portion 30c of the first semiconductor layer 30. The second channel protective film 45 is provided on the sixth portion 40c of the second semiconductor layer 40. The first channel protective film 35 protects the first semiconductor layer 30. The second channel protective film 45 protects the second semiconductor layer 40. The first channel protective film 35 and the second channel protective film 45 are made of e.g. silicon oxide film.

The first conductive unit 31 is provided on at least the first portion 30a of the first semiconductor layer 30. The first conductive unit 31 is e.g. in contact with the first portion 30a. Thus, the first conductive unit 31 is electrically connected to the first semiconductor layer 30.

The second conductive unit 32 is provided on at least the second portion 30b of the first semiconductor layer 30. The second conductive unit 32 is e.g. in contact with the second portion 30b. Thus, the second conductive unit 32 is electrically connected to the first semiconductor layer 30. Accordingly, a channel is generated in the first semiconductor layer 30 by applying a voltage to the first gate electrode 33. Thus, a current flows between the first conductive unit 31 and the second conductive unit 32.

The third conductive unit 41 is provided on at least the fourth portion 40a of the second semiconductor layer 40. The third conductive unit 41 is e.g. in contact with the fourth portion 40a. Thus, the third conductive unit 41 is electrically connected to the second semiconductor layer 40.

The fourth conductive unit 42 is provided on at least the fifth portion 40b of the second semiconductor layer 40. The fourth conductive unit 42 is e.g. in contact with the fifth portion 40b. Thus, the fourth conductive unit 42 is electrically connected to the second semiconductor layer 40. Accordingly, a channel is generated in the second semiconductor layer 40 by applying a voltage to the second gate electrode 43. Thus, a current flows between the third conductive unit 41 and the fourth conductive unit 42.

Each of the first conductive unit 31, the second conductive unit 32, the third conductive unit 41, and the fourth conductive unit 42 is made of e.g. Ti, Al, Mo and the like. Each of the first conductive unit 31, the second conductive unit 32, the third conductive unit 41, and the fourth conductive unit 42 may be e.g. a stacked body including at least one of Ti, Al, and Mo.

In this example, the first conductive unit 31 is provided on part of the first channel protective film 35. For instance, the first conductive unit 31 covers part of the first channel protective film 35. The second conductive unit 32 is provided on another part of the first channel protective film 35. For instance, the second conductive unit 32 covers another part of the first channel protective film 35.

In this example, the third conductive unit 41 is provided on part of the second channel protective film 45. For instance, the third conductive unit 41 covers part of the second channel protective film 45. The fourth conductive unit 42 is provided on another part of the second channel protective film 45. For instance, the fourth conductive unit 42 covers another part of the second channel protective film 45.

Part of the first channel protective film 35 is not covered with the first conductive unit 31 and the second conductive unit 32. In other words, part of the first channel protective film 35 does not overlap each of the first conductive unit 31 and the second conductive unit 32 as projected on e.g. the X-Y plane (the plane parallel to the upper surface 50a).

Part of the second channel protective film 45 is not covered with the third conductive unit 41 and the fourth conductive unit 42. In other words, part of the second channel protective film 45 does not overlap each of the third conductive unit 41 and the fourth conductive unit 42 as projected on e.g. the X-Y plane.

The first transistor 21 and the second transistor 22 thus configured facilitates profile reduction. For instance, the thickness (length in the Z-axis direction) of the first transistor 21 and the second transistor 22 can be suppressed.

The protective layer 52 is provided on the first transistor 21, on the second transistor 22, and on the insulating layer 56. The protective layer 52 covers the first transistor 21 and the second transistor 22. The protective layer 52 has insulating property. The protective layer 52 further has e.g. optical transmissivity. The protective layer 52 is provided with an opening 52a for exposing part of the first conductive unit 31. The protective layer 52 is made of e.g. one of silicon oxide film, silicon nitride film, and silicon oxynitride film.

The planarization layer 53 is provided on the protective layer 52. The planarization layer 53 has e.g. insulating property and optical transmissivity. The planarization layer 53 is provided with an opening 53a for exposing part of the first conductive unit 31. The opening 53a is provided at a position overlapping the opening 52a of the protective layer 52 as projected on the X-Y plane. The planarization layer 53 is made of e.g. one of silicon oxide film, silicon nitride film, and silicon oxynitride film.

The first electrode 11 is provided on the planarization layer 53. The first electrode 11 is made of e.g. a material having conductivity and optical transmissivity. The first electrode 11 is made of e.g. ITO. Part 11a of the first electrode 11 is inserted into the opening 52a and the opening 53a. The part 11a is e.g. in contact with the first conductive unit 31. Thus, the first electrode 11 is electrically connected to the first conductive unit 31.

The bank layer 54 is provided on the planarization layer 53 and on part of the first electrode 11. The bank layer 54 exposes part of the first electrode 11. The bank layer 54 defines e.g. a region constituting the light emitting element part 15. The bank layer 54 is made of e.g. a material having insulating property. The bank layer 54 is made of e.g. one of silicon oxide film, silicon nitride film, and silicon oxynitride film.

The organic light emitting layer 13 is provided on the first electrode 11 and on the bank layer 54. The organic light emitting layer 13 is e.g. in contact with the first electrode 11 in the portion of the first electrode 11 exposed from the bank layer 54. The organic light emitting layer 13 is made of e.g. a stacked body in which a hole transport layer, a light emitting layer, and an electron transport layer are stacked.

The second electrode 12 is provided on the organic light emitting layer 13. The second electrode 12 is made of a material having conductivity. The second electrode 12 is made of e.g. Al.

In this example, light emitted from the organic light emitting layer 13 is transmitted through the first electrode 11, the planarization layer 53, the protective layer 52, the insulating layer 56, the barrier layer 51, and the substrate 50 and emitted to the outside of the display device 110. That is, in this example, the display device 110 is of what is called the bottom emission type.

For instance, the second electrode 12 may be provided on the substrate 50. The organic light emitting layer 13 may be provided on the second electrode 12. The first electrode 11 may be provided on the organic light emitting layer 13. Thus, light may be emitted toward the side opposite from the substrate 50. That is, the display device 110 may be of the top emission type. In the case where the display device 110 is configured to be of the top emission type, each of the substrate 50, the barrier layer 51, the insulating layer 56, the protective layer 52, and the planarization layer 53 does not need to have optical transmissivity. For instance, the substrate 50 may include a non-optically transmissive base material such as paper and stainless steel, and an insulating layer provided on the base material.

For instance, in the display device 110, a color filter may be provided e.g. between the protective layer 52 and the planarization layer 53, or between the planarization layer 53 and the first electrode 11. Then, for instance, light with a desired color can be emitted.

The sealing layer 55 is provided on the second electrode 12. The sealing layer 55 covers the second electrode 12 and the organic light emitting layer 13. For instance, the sealing layer 55 protects the second electrode 12 and the organic light emitting layer 13. The sealing layer 55 is made of e.g. one of silicon oxide film, silicon nitride film, and silicon oxynitride film.

Figure 2:
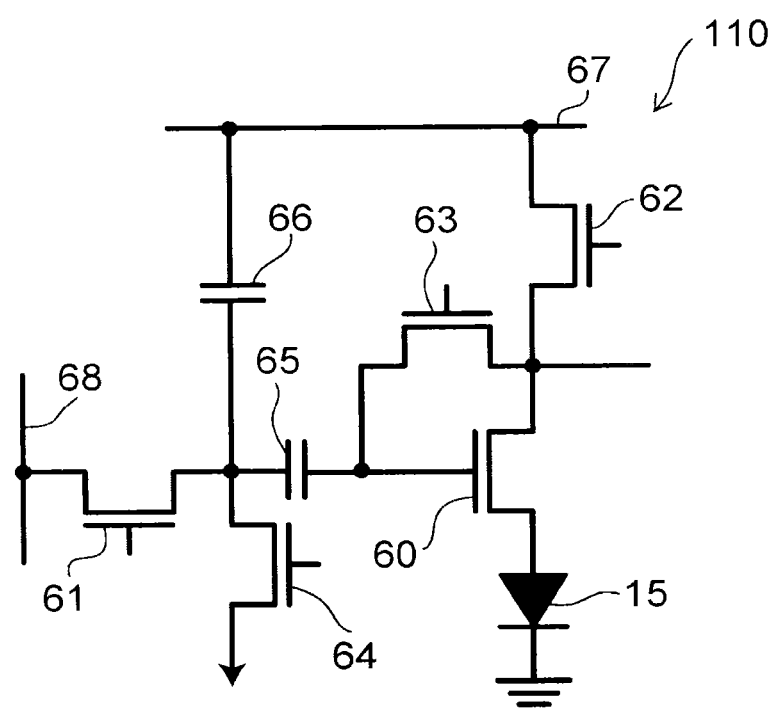
FIG. 2 is an equivalent circuit diagram schematically showing the display device according to the first embodiment.

FIG. 2 is an equivalent circuit diagram schematically showing the display device according to the first embodiment.

As shown in FIG. 2, the display device 110 includes e.g. a light emitting element part 15, a drive transistor 60, a write transistor 61, a light emission control transistor 62, a Vth detection transistor 63, a reset transistor 64, capacitors 65, 66, a power supply line 67, and a signal line 68. Each transistor 60-64 is e.g. an N-channel type thin film transistor.

The source of the drive transistor 60 is electrically connected to the anode of the light emitting element part 15. The source of the drive transistor 60 is electrically connected to e.g. the first electrode 11. The drain of the drive transistor 60 is electrically connected to the source of the light emission control transistor 62. The gate of the drive transistor 60 is electrically connected to one end of the capacitor 65 and the drain of the Vth detection transistor 63.

The drain of the write transistor 61 is electrically connected to the signal line 68. The source of the write transistor 61 is electrically connected to the other end of the capacitor 65. The source of the write transistor 61 is electrically connected to the gate of the drive transistor 60 through the capacitor 65. The gate of the write transistor 61 is electrically connected to a gate line (signal line), not shown.

The drain of the light emission control transistor 62 is electrically connected to the power supply line 67. The gate of the light emission control transistor 62 is electrically connected to a gate line, not shown.

The source of the Vth detection transistor 63 is electrically connected to the drain of the drive transistor 60. The gate of the Vth detection transistor 63 is electrically connected to a gate line, not shown.

The drain of the reset transistor 64 is electrically connected to the other end of the capacitor 65. The drain of the reset transistor 64 is electrically connected to the gate of the drive transistor 60 through the capacitor 65. The source of the reset transistor 64 is electrically connected to a reset line, not shown. The gate of the reset transistor 64 is electrically connected to a gate line, not shown.

One end of the capacitor 66 is electrically connected to the power supply line 67. The other end of the capacitor 66 is electrically connected to the other end of the capacitor 65.

In the display device 110, when the light emitting element part 15 is caused to emit light, first, only the reset transistor 64 of the transistors 61-64 is turned on, and the others are turned off. Thus, the voltage across the capacitor 65 is made substantially equal to the reset voltage applied to the reset line.

That is, the gate voltage of the drive transistor 60 is made substantially equal to the reset voltage.

Subsequently, the reset transistor 64 is turned off, and the Vth detection transistor 63 is turned on. This turns on the drive transistor 60. Thus, a current flows between the drain and the source of the drive transistor 60 in accordance with the charge accumulated in the capacitor 65.

When the voltage of the capacitor 65 falls below the threshold voltage Vth of the drive transistor 60, the drive transistor 60 is turned off, and the current ceases to flow in the drive transistor 60. Thus, the voltage across the capacitor 65 is made substantially equal to the threshold voltage Vth of the drive transistor 60. That is, the threshold voltage Vth of the drive transistor 60 is detected.

Next, the Vth detection transistor 63 is turned off, and the write transistor 61 is turned on. Thus, the voltage of the capacitor 65 is set to the voltage applied to the signal line 68. More specifically, the voltage of the capacitor 65 is set to the voltage obtained by dividing the voltage of the signal line 68 in the capacitance ratio between the capacitor 65 and the capacitor 66.

Next, the write transistor 61 is turned off, and the light emission control transistor 62 is turned on. Thus, the current corresponding to the voltage set to the capacitor 65 flows between the drain and the source of the drive transistor 60 and in the light emitting element part 15. Accordingly, the light emitting element part 15 emits light.

The gate of each of the transistors 61-64 is applied with a negative voltage e.g. when the transistor 61-64 is set to the off-state. This can suppress the occurrence of leakage in each of the transistors 61-64. On the other hand, the gate of the drive transistor 60 is generally applied with a positive voltage.

The gate voltage of the drive transistor 60 is e.g. 0 V or more and 10 V or less. The gate voltage of the drive transistor 60 at the time of setting the drive transistor 60 to the off-state is e.g. 0 V or more and 5 V or less. The gate voltage of the drive transistor 60 at the time of setting the drive transistor 60 to the on-state is e.g. 1 V or more and 10 V or less.

The gate voltage of each of the transistors 61-64 is e.g. −20 V or more and 30 V or less. In each of the transistors 61-64, the gate voltage at the time of setting the transistor to the off-state is e.g. −20 V or more and 0 V or less. In each of the transistors 61-64, the gate voltage at the time of setting the transistor to the on-state is e.g. 0 V or more and 30 V or less.

The absolute value of the gate voltage of each of the transistors 61-64 is larger than e.g. the absolute value of the gate voltage of the drive transistor 60. Here, the "on-state" is e.g. the state in which a voltage more than or equal to the threshold voltage is applied to the gate. The "off-state" is e.g. the state in which a voltage less than the threshold voltage is applied to the gate.

The first transistor 21 shown in FIG. 1 corresponds to e.g. the drive transistor 60. The drive transistor 60 is e.g. a thin film transistor for controlling the supply current to the light emitting element part 15.

The second transistor 22 corresponds to e.g. at least one of the write transistor 61, the light emission control transistor 62, the Vth detection transistor 63, and the reset transistor 64. Each transistor 61-64 is what is called a switch transistor.

In the second transistor 22, the third conductive unit 41 is electrically connected to one of the first conductive unit 31, the second conductive unit 32, and the first gate electrode 33 of the first transistor 21. For instance, the third conductive unit 41 is electrically connected to one of the drain, source, and gate of the drive transistor 60.

The first transistor 21 is not limited to the drive transistor 60. For instance, the first transistor 21 may be any transistor including a first conductive unit 31 electrically connected to one of the first electrode 11 and the second electrode 12, where the first gate electrode 33 does not need to be applied with a negative voltage.

The second transistor 22 is not limited to the above transistors 61-64. For instance, the second transistor 22 may be any transistor including a third conductive unit 41 electrically connected to one of the first conductive unit 31, the second conductive unit 32, and the first gate electrode 33, where the second gate electrode 43 is applied with a negative voltage. Here, the negative voltage refers to the state in which e.g. the potential set to the gate is lower than the potential set to the source.

The first gate insulating film 34 of the first transistor 21 and the second gate insulating film 44 of the second transistor 22 each relate to e.g. the duty cycle of the driving stress, and depend on the criticality of leakage occurrence. For instance, preferably, the thin film transistor constituting the peripheral gate driver circuit is also formed similarly to the second transistor 22.

The inventor evaluated the characteristics of the thin film transistor including an InGaZnO film by fabricating a plurality of samples and performing an experiment thereon. In the experiment, the current-voltage characteristic of each sample was obtained by measuring the drain current while changing the gate voltage. In the experiment, a negative voltage (negative bias stress) is applied to the gate under light irradiation. That is, the change of the current-voltage characteristic between before and after application of negative bias stress was obtained.

Figure 3A:
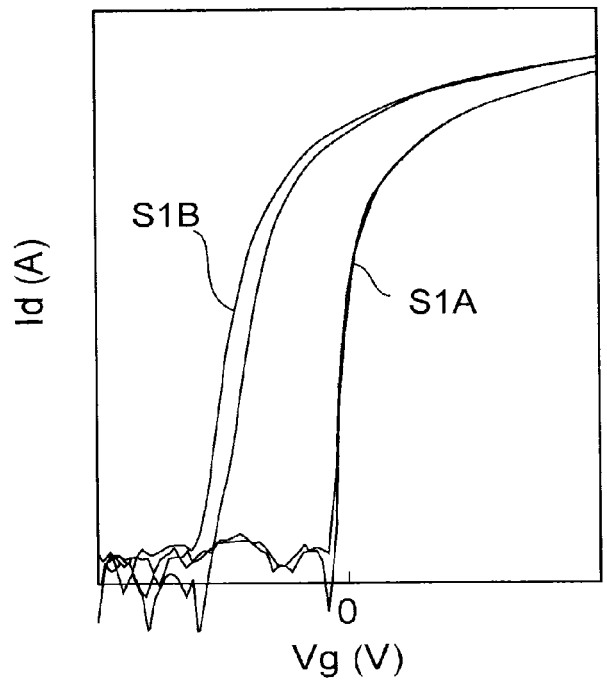
FIGS. 3A and 3B are graphs showing an example of the current-voltage characteristic of the thin film transistor.
Figure 3B:
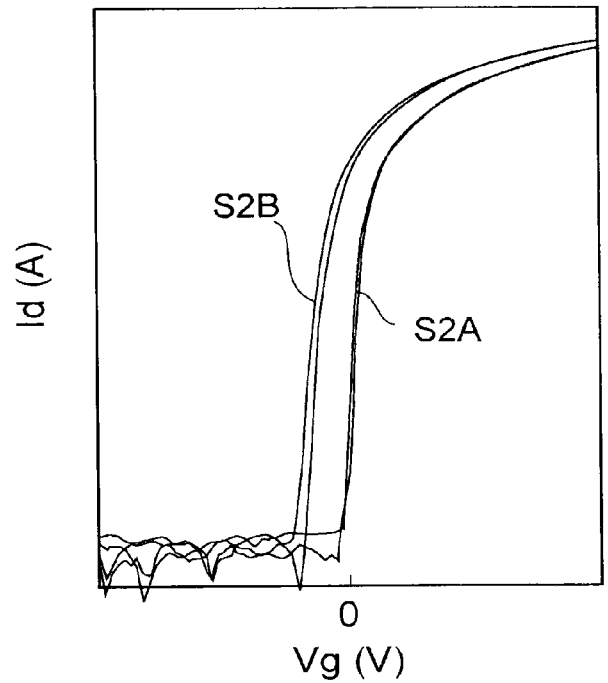

FIGS. 3A and 3B are graphs showing an example of the current-voltage characteristic of the thin film transistor.

FIG. 3A shows the characteristic S1A before negative bias stress application, and the characteristic S1B after negative bias stress application, of a first sample. FIG. 3B shows the characteristic S2A before negative bias stress application, and the characteristic S2B after negative bias stress application, of a second sample. In FIGS. 3A and 3B, the horizontal axis represents gate voltage Vg (V), and the vertical axis represents drain current Id (A).

In the first sample, the thickness of the gate insulating film was set to 350 nm. In the second sample, the thickness of the gate insulating film was set to 175 nm. That is, the thickness of the gate insulating film of the second sample was set to half the thickness of the gate insulating film of the first sample. In the first sample and the second sample, a negative bias stress was applied for a fixed time in the state in which light including a wavelength of 450 nm or less was incident on the sample. The current-voltage characteristic was measured before and after the application.

As shown in FIG. 3A, in the first sample, the threshold voltage was significantly shifted to the negative side by application of negative bias stress. Thus, it has turned out that the tolerance to the negative gate voltage is prone to degradation in the environment of light incidence.

In the display device, light emitted from the organic light emitting layer and external light are incident on the thin film transistor. Thus, in the display device and the thin film transistor used in the display device, it is desired to suppress the degradation of characteristics for the negative gate voltage in the case of light incidence.

As shown in FIG. 3B, in the second sample, the degradation of characteristics for the negative gate voltage under light irradiation is suppressed compared with the first sample. Thus, it has turned out that in the thin film transistor including an InGaZnO film, the degradation of characteristics for the negative gate voltage under light irradiation can be suppressed by thinning the gate insulating film.

It is considered that this results from the amount of hydrogen diffused from the gate insulating film into the InGaZnO film in the annealing treatment of the process for manufacturing the TFT. Thinning the gate insulating film decreases the amount of hydrogen included in the gate insulating film. This also decreases the amount of hydrogen diffused from the gate insulating film into the InGaZnO film in the annealing. It is considered that the degradation of characteristics was thus suppressed.

The inventor also evaluated the relationship between the thickness of the gate insulating film and the initial threshold voltage. The inventor further evaluated the change of the current-voltage characteristic between before and after the stress test of applying a positive voltage to the gate for a fixed time.

Figure 4A:
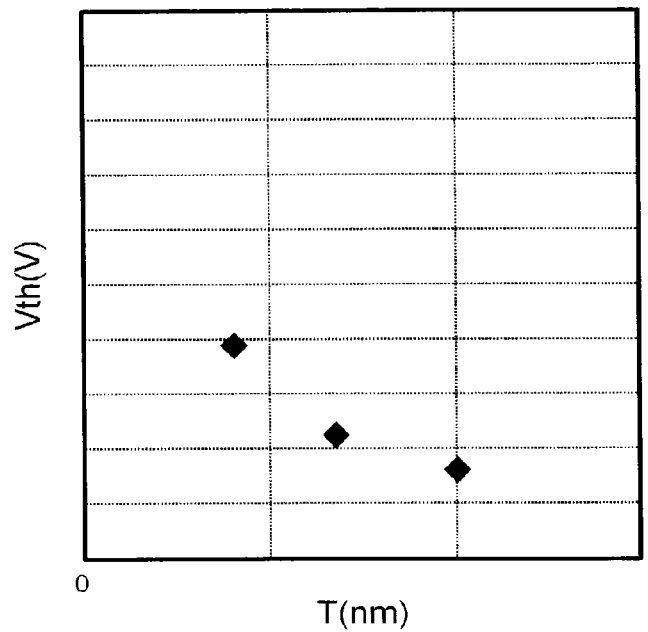
FIGS. 4A and 4B are graphs showing an example of the characteristics of the thin film transistor.
Figure 4B:
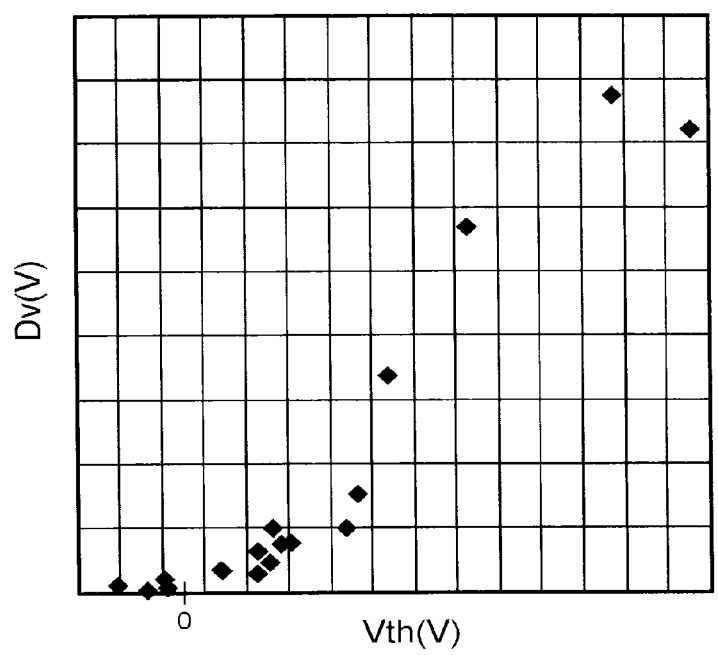

FIGS. 4A and 4B are graphs showing an example of the characteristics of the thin film transistor.

FIG. 4A is a graph showing the relationship between the thickness of the gate insulating film and the initial threshold voltage. In FIG. 4A, the horizontal axis represents the film thickness T (nm) of the gate insulating film, and the vertical axis represents the initial threshold voltage Vth (V).

FIG. 4B is a graph showing the relationship between the initial threshold voltage and the variation of the initial threshold voltage. In FIG. 4B, the horizontal axis represents the initial threshold voltage Vth (V), and the vertical axis represents the variation Dv (V) of the initial threshold voltage. The variation Dv specifically refers to the value obtained by subtracting the threshold voltage before the positive bias stress test (initial threshold voltage) from the threshold voltage after the positive bias stress test. That is, the variation Dv is given by Dv=Vth2−Vth1, where Vth1 is the threshold voltage before the stress test, and Vth2 is the threshold voltage after the stress test.

As shown in FIG. 4A, the initial threshold voltage Vth is higher as the film thickness T of the gate insulating film is made thinner. The initial threshold voltage Vth is shifted to the positive side by thinning the film thickness T of the gate insulating film.

As shown in FIG. 4B, the variation Dv is larger for a higher initial threshold voltage Vth. That is, it has turned out that in the thin film transistor including an InGaZnO film, the tolerance to the positive gate voltage is more prone to degradation for a higher initial threshold voltage Vth. Thus, the gate insulating film is thickened for a positive gate voltage. This can enhance the tolerance to the positive gate voltage. For instance, hydrogen is moderately supplied from the gate insulating film to the InGaZnO film in the annealing treatment of the process for manufacturing the TFT. It is considered that this can enhance the tolerance to the positive gate voltage.

Thus, it has turned out that in the thin film transistor including an InGaZnO film, thinning the gate insulating film can enhance the tolerance to the negative gate voltage under light irradiation, but is likely to cause degradation for the positive gate voltage. That is, it is considered that decreasing the amount of hydrogen included in the gate insulating film can enhance the tolerance to the negative gate voltage, but is likely to cause degradation for the positive gate voltage. This is a novel effect discovered by the inventor's investigation.

In the display device 110 according to this embodiment, the thickness t1 of the first gate insulating film 34 of the first transistor 21 is made thicker than the thickness t2 of the second gate insulating film 44 of the second transistor 22. That is, in the first transistor 21 in which a positive gate voltage is primarily applied to the first gate electrode 33, the thickness t1 of the first gate insulating film 34 is thickened. In the second transistor 22 in which a negative gate voltage is primarily applied to the second gate electrode 43, the thickness t2 of the second gate insulating film 44 is thinned. Thus, the tolerance to the positive gate voltage can be enhanced in the first transistor 21. This can enhance the reliability of the first transistor 21. Furthermore, the tolerance to the negative gate voltage can be enhanced in the second transistor 22. This can enhance the reliability of the second transistor 22. Thus, a high reliability is achieved in the display device 110.

Next, an example of a method for manufacturing the display device 110 is described.

In the manufacturing of the display device 110, first, an SiN layer is formed 200 nm by PE-CVD technique on the major surface 50a of a glass substrate as a substrate 50. Thus, a barrier layer 51 is formed on the major surface 50a.

A stacked film of Al film and Mo film is formed on the barrier layer 51. The stacked film constitutes a first gate electrode 33 and a second gate electrode 43. The thickness of the Al film is e.g. 150 nm. The thickness of the Mo film is e.g. 30 nm. Formation of the Al film and the Mo film is performed by e.g. sputtering. Subsequently, the stacked film is processed into a prescribed pattern. Thus, a first gate electrode 33 and a second gate electrode 43 are formed from the stacked film. The processing of the stacked film is performed by e.g. photolithography. Etching is performed using e.g. a mixed acid of phosphoric acid, acetic acid, and nitric acid.

An $SiO_2$ film constituting an insulating layer 56 is formed to a thickness of e.g. 200 nm by plasma CVD (plasma enhanced chemical vapor deposition, PE-CVD) technique using e.g. TEOS (tetraethyl orthosilicate). Subsequently, the portion of the $SiO_2$ film located on the second gate electrode 43 is etched by photolithography and thinned to 100 nm. Thus, a first gate insulating film 34 and a second gate insulating film 44 are formed. That is, the thickness t1 of the first gate insulating film 34 is made thicker than the thickness t2 of the second gate insulating film 44.

On the insulating layer 56, an InGaZnO film (e.g., $In_2O_3$—$Ga_2O_3$—ZnO film) constituting a first semiconductor layer 30 and a second semiconductor layer 40 is formed to a thickness of e.g. 30 nm by reactive DC sputtering technique. At this time, the composition ratio of the target used is e.g. 1:1:1 in terms of the atomic number ratio of In:Ga:Zn. The partial pressure of oxygen at the time of film formation is e.g. 0.007 Pa. Film formation of the InGaZnO film does not need heating and the like. Thus, the film formation temperature is approximately several ten ° C.

Subsequently, the InGaZnO film is processed into a prescribed shape by photolithography. Thus, a first semiconductor layer 30 and a second semiconductor layer 40 are formed from the InGaZnO film. The etching liquid is e.g. oxalic acid diluted with water.

An $SiO_2$ film is formed by PE-CVD technique or the like on the first semiconductor layer 30 and the second semiconductor layer 40. Then, the $SiO_2$ film is processed into a prescribed shape by photolithography. Thus, a first channel protective film 35 and a second channel protective film 45 are formed from the $SiO_2$ film.

Furthermore, although not shown, an opening for extracting the first gate electrode 33 and an opening for extracting the second gate electrode 43 are each formed in the insulating layer 56. Subsequently, a Mo film having a thickness of 50 nm, an Al film having a thickness of 200 nm, and a Mo film having a thickness of 50 nm are sequentially formed by sputtering and processed into a prescribed shape. Thus, a first conductive unit 31, a second conductive unit 32, a third conductive unit 41, and a fourth conductive unit 42 are formed from the stacked film of Mo film/Al film/Mo film.

A stacked film of $SiO_2$ and $SiN_x$ is formed as a protective layer 52 by PE-CVD technique using $SiH_4$ gas and the like. Then, respective portions for extracting the first conductive unit 31, the second conductive unit 32, the third conductive unit 41, and the fourth conductive unit 42 are formed in the protective layer 52. For instance, an opening 52a is formed. Thus, a first transistor 21 and a second transistor 22 are completed.

The first transistor 21 and the second transistor 22 immediately after the process have been damaged by ultraviolet radiation and the like during the process. Thus, for instance, annealing treatment (heating treatment) is performed in an annealing furnace. The temperature of the annealing treatment is e.g. 250° C. The time of the annealing treatment is e.g. 1 hour.

Next, a light emitting element part 15 is formed. First, a planarization layer 53 is formed from HRC (organic insulating film) on the protective layer 52. Then, an opening 53a being a contact part of the first electrode 11 is formed in the planarization layer 53. Next, a film of ITO is formed and patterned to form a first electrode 11 on the planarization layer 53. A bank layer 54 is formed from HRC on the planarization layer 53 and on the first electrode 11. Subsequently, an organic light emitting layer 13 and a second electrode 12 are formed. The organic light emitting layer 13 is formed by e.g. evaporation technique. The second electrode 12 is formed as e.g. a stacked film of LiF film and Al film by evaporation technique. Then, a stacked film of silicon nitride film and organic resin is formed as a sealing layer 55. Thus, the light emitting element part 15 is film-sealed.

Thus, the display device 110 is completed.

Second Embodiment

Figure 5:
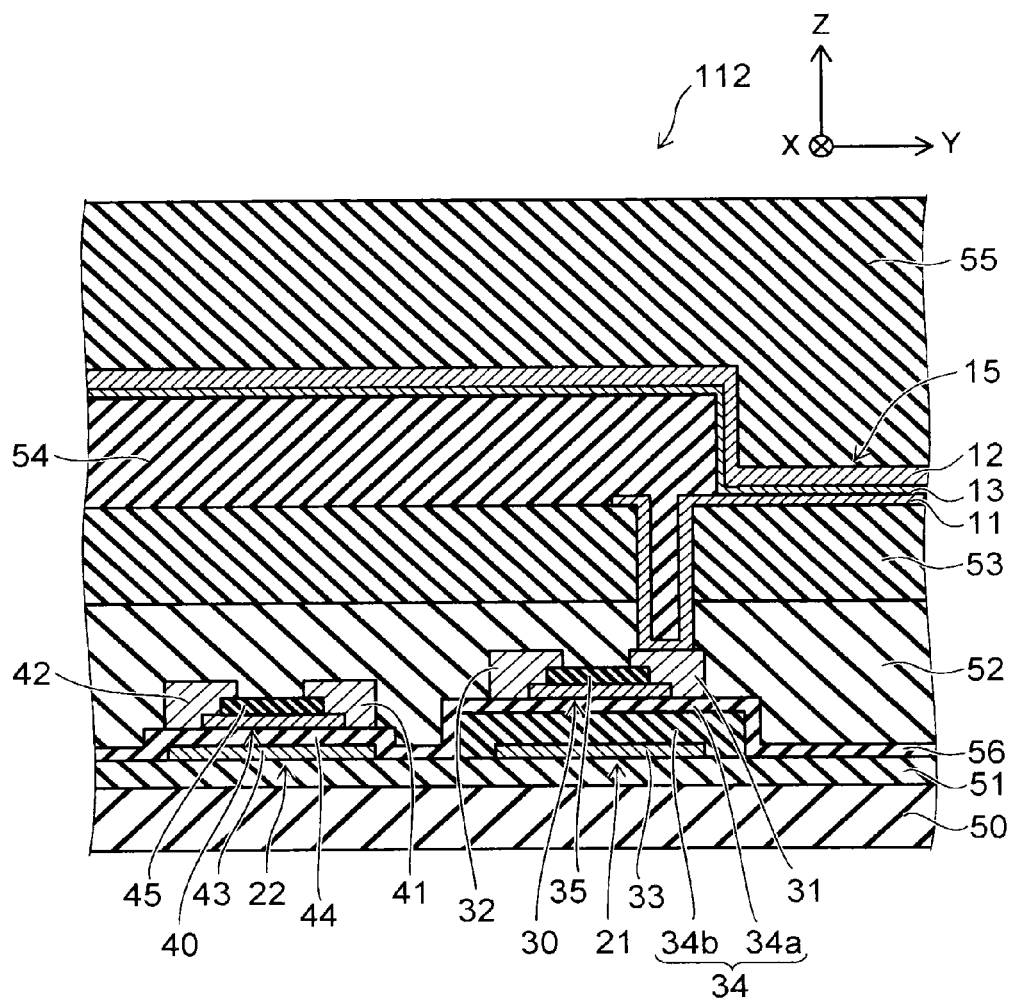
FIG. 5 is a sectional view schematically showing a display device according to a second embodiment.

FIG. 5 is a sectional view schematically showing a display device according to a second embodiment.

As shown in FIG. 5, in the display device 112, the first gate insulating film 34 includes a first layer 34a and a second layer 34b. The second layer 34b is provided between the first gate electrode 33 and the first layer 34a. The first layer 34a is e.g. continuous with the second gate insulating film 44. The material of the first layer 34a is substantially the same as the material of the second gate insulating film 44. In this example, the first layer 34a and the second gate insulating film 44 constitute a single continuous insulating layer 56.

The thickness of the first layer 34a is substantially equal to the thickness of the second gate insulating film 44. That is, in the display device 112, the thickness of the first gate insulating film 34 is made thicker than the thickness of the second gate insulating film 44 by providing the second layer 34b. The thickness of the first layer 34a and the thickness of the second gate insulating film 44 are e.g. 5 nm or more and 500 nm or less. The thickness of the second layer 34b is e.g. 10 nm or more and 1000 nm or less.

The material of the second layer 34b may be the same as or different from the material of the first layer 34a. For instance, the hydrogen concentration of the second layer 34b is made higher than the hydrogen concentration of the first layer 34a and the second gate insulating film 44. Thus, for instance, the amount of hydrogen included in the first gate insulating film 34 can be made larger, and the amount of hydrogen included in the second gate insulating film 44 can be made smaller. For instance, the tolerance to the positive gate voltage can be enhanced in the first transistor 21. The tolerance to the negative gate voltage can be enhanced in the second transistor 22. Thus, a higher reliability is achieved in the display device 112.

The first layer 34a and the second gate insulating film 44 are made of e.g. silicon oxide film. The second layer 34b is made of e.g. one of silicon oxide film, silicon nitride film, and silicon oxynitride film. For instance, in silicon nitride film, the concentration of hydrogen can be increased more easily than in silicon oxide film. Thus, for instance, the first layer 34a and the second gate insulating film 44 are made of silicon oxide film, and the second layer 34b is made of silicon nitride film. This can facilitate increasing e.g. the amount of hydrogen included in the first gate insulating film 34.

In the case where the first layer 34a and the second layer 34b are made of silicon oxide film, for instance, an $SiO_2$ film constituting the second layer 34b is formed to a thickness of 100 nm under the condition of high $SiH_4/N_2O$ ratio after forming the first gate electrode 33 and the second gate electrode 43. Subsequently, the portion of the $SiO_2$ film located on the second gate electrode 43 is etched away by photolithography. Thus, the second layer 34b is formed from the $SiO_2$ film.

Next, an $SiO_2$ film constituting the first layer 34a and the second gate insulating film 44 is formed to a thickness of 50 nm under the condition of low $SiH_4/N_2O$ ratio. Thus, the first gate insulating film 34 and the second gate insulating film 44 of the display device 112 are formed.

In the case where the first layer 34a is made of silicon oxide film and the second layer 34b is made of silicon nitride film, for instance, an $SiN_x$ film constituting the second layer 34b is formed to a thickness of 100 nm after forming the first gate electrode 33 and the second gate electrode 43. Subsequently, the portion of the $SiN_x$ film located on the second gate electrode 43 is etched away by photolithography. Thus, the second layer 34b is formed from the $SiN_x$ film.

Next, an $SiO_2$ film constituting the first layer 34a and the second gate insulating film 44 is formed to a thickness of 50 nm under the condition of low $SiH_4/N_2O$ ratio. Thus, the first gate insulating film 34 and the second gate insulating film 44 of the display device 112 are formed.

Figure 6:
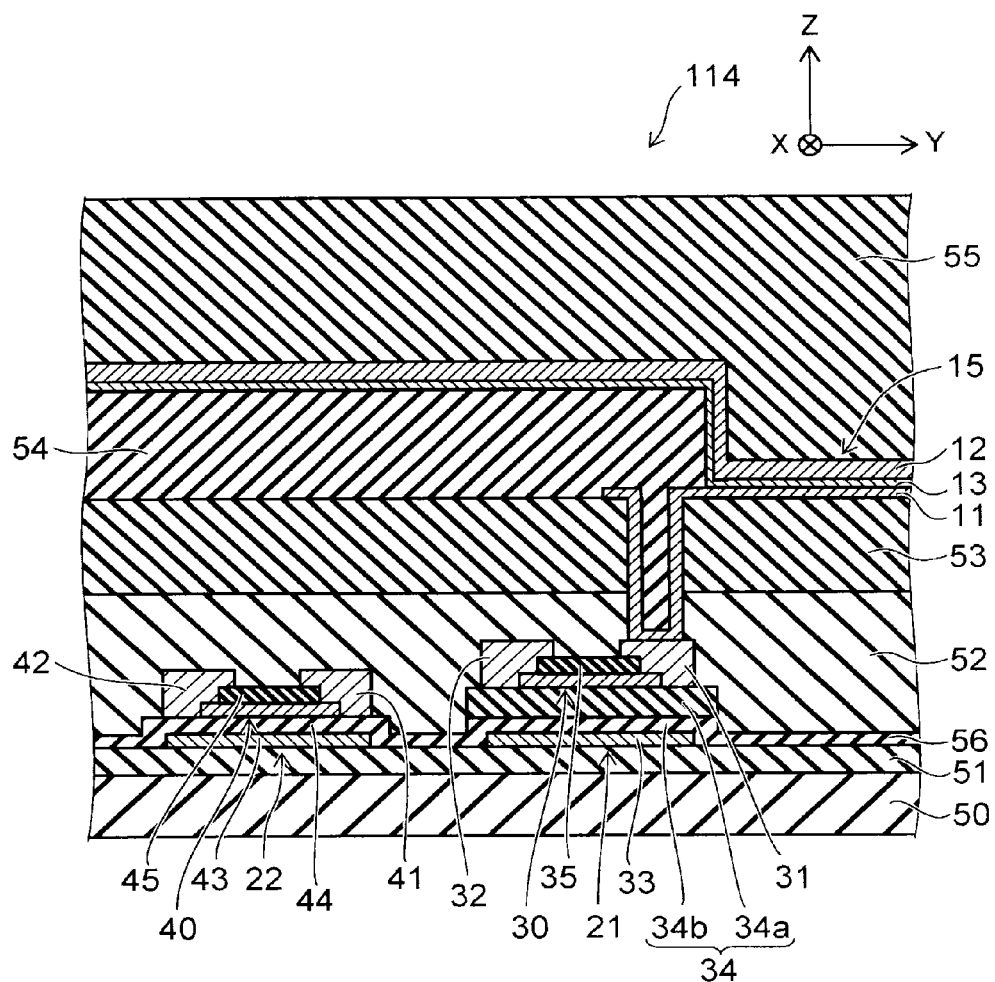
FIG. 6 is a sectional view schematically showing an alternative display device according to the second embodiment.

FIG. 6 is a sectional view schematically showing an alternative display device according to the second embodiment.

As shown in FIG. 6, in the display device 114, the second layer 34b is continuous with the second gate insulating film 44. The material of the second layer 34b is substantially the same as the material of the second gate insulating film 44. In this example, the second layer 34b and the second gate insulating film 44 constitute a single continuous insulating layer 56. The thickness of the second layer 34b is substantially equal to the thickness of the second gate insulating film 44. The relationship between the thickness of the first layer 34a and the thickness of the second layer 34b is e.g. opposite to that of the display device 112.

Thus, the second layer 34b may be made continuous with the second gate insulating film 44. In this case, for instance, the second layer 34b and the second gate insulating film 44 are made of silicon oxide film, and the first layer 34a is made of silicon nitride film. This can facilitate increasing e.g. the amount of hydrogen included in the first gate insulating film 34. That is, the concentration of hydrogen of the first layer 34a can be made higher than the concentration of hydrogen of the second layer 34b and the concentration of hydrogen of the second gate insulating film 44.

Third Embodiment

Figure 7:
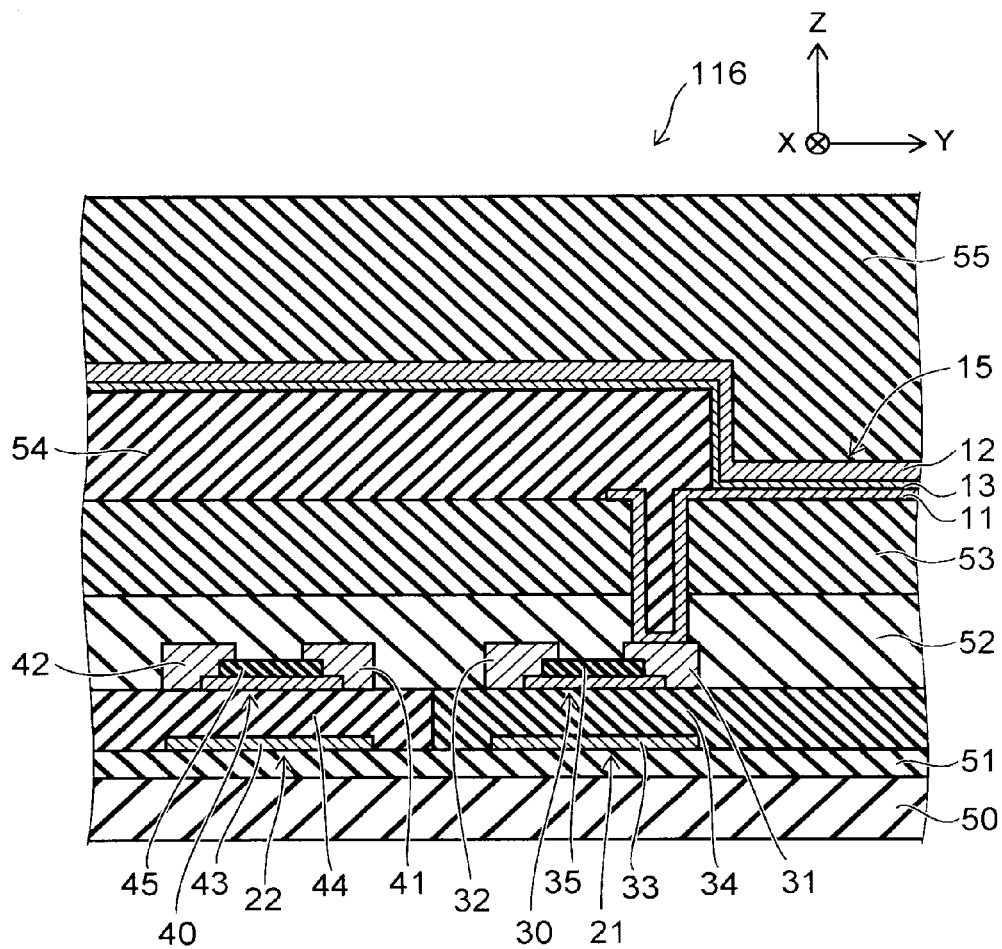
FIG. 7 is a sectional view schematically showing a display device according to a third embodiment.

FIG. 7 is a sectional view schematically showing a display device according to a third embodiment.

As shown in FIG. 7, in the display device 116, the thickness of the first gate insulating film 34 is substantially equal to the thickness of the second gate insulating film 44. In this example, the concentration of hydrogen per unit volume of the first gate insulating film 34 is higher than the concentration of hydrogen per unit volume of the second gate insulating film 44. That is, in this example, the material of the first gate insulating film 34 is different from the material of the second gate insulating film 44.

In this example, the concentration of hydrogen per unit volume of the first gate insulating film 34 is e.g. $10^{20}$ atoms/cm$^3$ or more and $10^{22}$ atoms/cm$^3$ or less. The concentration of hydrogen per unit volume of the second gate insulating film 44 is e.g. $10^{19}$ atoms/cm$^3$ or more and $10^{21}$ atoms/cm$^3$ or less.

Thus, in the first gate insulating film 34 and the second gate insulating film 44, the thickness may be made substantially equal, and the concentration of hydrogen may be made different. Also in the display device 116, as in the above embodiments, the tolerance to the positive gate voltage can be enhanced in the first transistor 21. The tolerance to the negative gate voltage can be enhanced in the second transistor 22. Thus, a high reliability is achieved in the display device 116.

Fourth Embodiment

Figure 8:
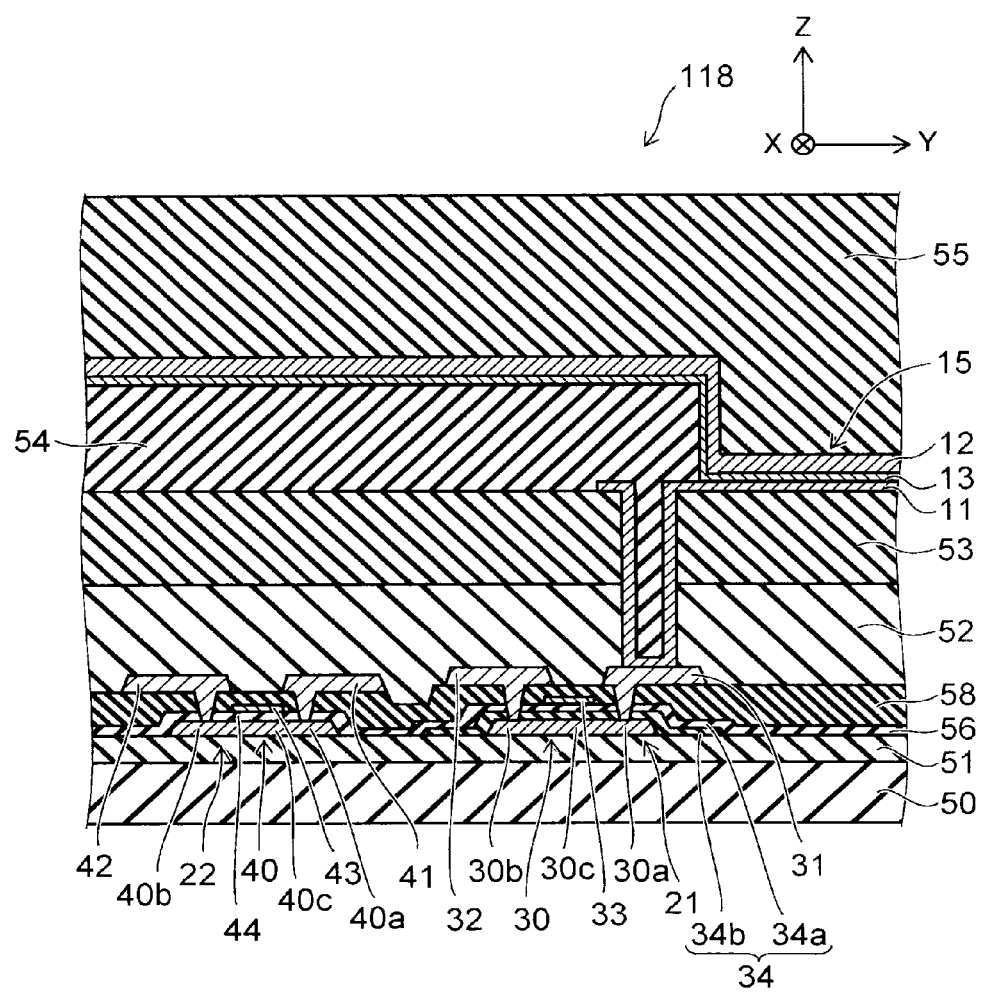
FIG. 8 is a sectional view schematically showing a display device according to a fourth embodiment.

FIG. 8 is a sectional view schematically showing a display device according to a fourth embodiment.

As shown in FIG. 8, in the display device 118, the first transistor 21 and the second transistor 22 are different from those of the above embodiments.

Also in the display device 118, the first transistor 21 includes a first semiconductor layer 30, a first conductive unit 31, a second conductive unit 32, a first gate electrode 33, and a first gate insulating film 34. The first conductive unit 31 is electrically connected to the first portion 30a. The second conductive unit 32 is separated from the first conductive unit 31 and electrically connected to the second portion 30b. The first gate electrode 33 is separated from the first conductive unit 31 and the second conductive unit 32, and opposes the third portion 30c. The first gate insulating film 34 is provided between the third portion 30c and the first gate electrode 33.

Also in the display device 118, the second transistor 22 includes a second semiconductor layer 40, a third conductive unit 41, a fourth conductive unit 42, a second gate electrode 43, and a second gate insulating film 44. The third conductive unit 41 is electrically connected to the fourth portion 40a. The fourth conductive unit 42 is separated from the third conductive unit 41 and electrically connected to the fifth portion 40b. The second gate electrode 43 is separated from the third conductive unit 41 and the fourth conductive unit 42, and opposes the sixth portion 40c. The second gate insulating film 44 is provided between the sixth portion 40c and the second gate electrode 43.

On the other hand, in the display device 118, in the first transistor 21, the first semiconductor layer 30 is provided on the barrier layer 51. The first gate insulating film 34 is provided on the first semiconductor layer 30. The first gate electrode 33 is provided on the first gate insulating film 34. The first conductive unit 31 is provided on the first portion 30a. The second conductive unit 32 is provided on the second portion 30b.

Similarly, in the display device 118, in the second transistor 22, the second semiconductor layer 40 is provided on the barrier layer 51. The second gate insulating film 44 is provided on the second semiconductor layer 40. The second gate electrode 43 is provided on the second gate insulating film 44.

The third conductive unit 41 is provided on the fourth portion 40a. The fourth conductive unit 42 is provided on the fifth portion 40b.

That is, in the display device 118, the first transistor 21 and the second transistor 22 are of what is called the top gate type. In the first transistor 21 and the second transistor 22 of the top gate type, the amount of hydrogen included in the first gate insulating film 34 is made larger than the amount of hydrogen included in the second gate insulating film 44. For instance, the first gate insulating film 34 is thickened. Alternatively, the concentration of hydrogen of the first gate insulating film 34 is increased. Thus, also in the display device 118, the reliability of the display device 118 can be enhanced as in the above embodiments.

In this example, a protective layer 58 is provided on the insulating layer 56. The first conductive unit 31, the second conductive unit 32, the third conductive unit 41, and the fourth conductive unit 42 are provided on the protective layer 58. The protective layer 58 is provided as necessary, and can be omitted. The protective layer 58 can be made of e.g. the material described with reference to the protective layer 52.

Fifth Embodiment

Figure 9:
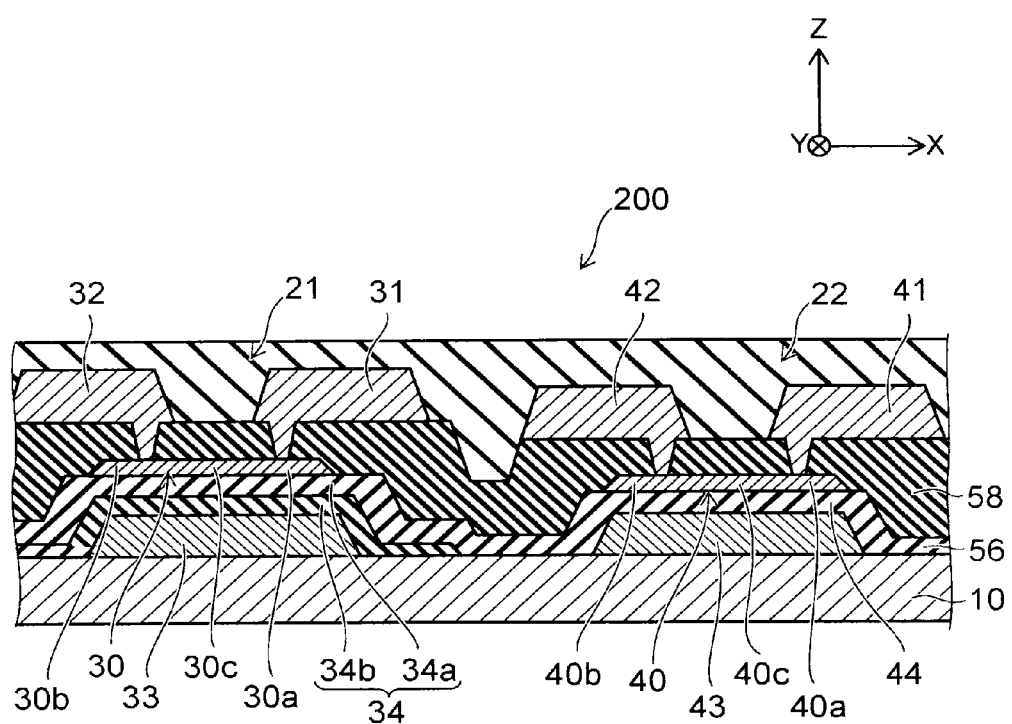
FIG. 9 is a sectional view schematically showing a semiconductor device according to a fifth embodiment.

FIG. 9 is a sectional view schematically showing a semiconductor device according to a fifth embodiment.

As shown in FIG. 9, the semiconductor device 200 includes a first transistor 21 and a second transistor 22. The first transistor 21 and the second transistor 22 can be one of those described in the above embodiments.

In the semiconductor device 200, the amount of hydrogen included in the first gate insulating film 34 is made larger than the amount of hydrogen included in the second gate insulating film 44. This can enhance the reliability of the semiconductor device 200.

The semiconductor device 200 is used to manufacture the display device 110 and the like described in the above embodiments. The semiconductor device 200 may be used in other than display devices.

The embodiments provide a display device and a semiconductor device having high reliability.

In this specification, "perpendicular" and "parallel" mean not only being exactly perpendicular and exactly parallel, but include, for instance, variations in the manufacturing process, and only need to mean being substantially perpendicular and substantially parallel. In this specification, the state of being "provided on" includes not only the state of being provided in direct contact, but also the state of being provided with another element interposed in between. The state of being "stacked" includes not only the state of being stacked in contact with each other, but also the state of being stacked with another element interposed in between. The state of being "opposed" includes not only the state of directly facing, but also indirectly facing with another element interposed in between. In this specification, "electrically connected" includes not only the case of being connected by direct contact, but also the case of being connected via another conductive member or the like.

The embodiments of the invention have been described above with reference to examples.

However, the embodiments of the invention are not limited to these examples. For instance, any specific configurations of various components such as the first electrode, second electrode, organic light emitting layer, first transistor, first semiconductor layer, first conductive unit, second conductive unit, first gate electrode, first gate insulating film, second transistor, second semiconductor layer, third conductive unit, fourth conductive unit, second gate electrode, second gate insulating film, first layer, second layer, first channel protective film, and second channel protective film included in the display device and the semiconductor device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible. Such combinations are also encompassed within the scope of the invention as long as they fall within the spirit of the invention.

Moreover, all display devices and semiconductor devices practicable by an appropriate design modification by one skilled in the art based on the display devices and the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A display device comprising:
   a first electrode being optical transparency;
   a second electrode opposing the first electrode;
   an organic light emitting layer provided between the first electrode and the second electrode;
   a first transistor including:
      a first semiconductor layer including a first portion, a second portion, and a third portion provided between the first portion and the second portion;
      a first conductive unit electrically connected to one of the first electrode and the second electrode and electrically connected to the first portion;
      a second conductive unit separated from the first conductive unit and electrically connected to the second portion;
      a first gate electrode separated from the first conductive unit, the second conductive unit, and the first semiconductor layer, and the first gate electrode opposing the third portion; and
      a first gate insulating film provided between the third portion and the first gate electrode; and
   a second transistor including:
      a second semiconductor layer including a fourth portion, a fifth portion, and a sixth portion provided between the fourth portion and the fifth portion;
      a third conductive unit electrically connected to one of the first conductive unit, the second conductive unit, and the first gate electrode and electrically connected to the fourth portion;
      a fourth conductive unit separated from the third conductive unit and electrically connected to the fifth portion;
      a second gate electrode separated from the third conductive unit, the fourth conductive unit, and the second semiconductor layer, and the second gate electrode opposing the sixth portion; and
      a second gate insulating film provided between the sixth portion and the second gate electrode,
   an amount of hydrogen included in the first gate insulating film being larger than an amount of hydrogen included in the second gate insulating film.

2. The device according to claim 1, wherein a thickness of the first gate insulating film is thicker than a thickness of the second gate insulating film.

3. The device according to claim 2, wherein the second gate insulating film is continuous with the first gate insulating film.

4. The device according to claim 2, wherein
   the thickness of the first gate insulating film is 10 nm or more and 1000 nm or less, and
   the thickness of the second gate insulating film is 5 nm or more and 500 nm or less.

5. The device according to claim 1, wherein a concentration of hydrogen per unit volume of the first gate insulating film is higher than a concentration of hydrogen per unit volume of the second gate insulating film.

6. The device according to claim 5, wherein
   the concentration of hydrogen per unit volume of the first gate insulating film is $10^{20}$ atoms/cm$^3$ or more and $10^{22}$ atoms/cm$^3$ or less, and
   the concentration of hydrogen per unit volume of the second gate insulating film is $10^{19}$ atoms/cm$^3$ or more and $10^{21}$ atoms/cm$^3$ or less.

7. The device according to claim 1, wherein the first gate insulating film and the second gate insulating film include at least one of silicon oxide film, silicon nitride film, and silicon oxynitride film.

8. The device according to claim 1, wherein the first gate insulating film includes a first layer and a second layer provided between the first gate electrode and the first layer.

9. The device according to claim 8, wherein
   the first layer includes silicon oxide film and the second layer includes silicon nitride film, or the first layer includes silicon nitride film and the second layer includes silicon oxide film.

10. The device according to claim 8, wherein the first layer is continuous with the second gate insulating film.

11. The device according to claim 10, wherein
    the first layer includes silicon oxide film,
    the second layer includes silicon nitride film, and
    the second gate insulating film includes silicon oxide film.

12. The device according to claim 10, wherein a concentration of hydrogen of the second layer is higher than a concentration of hydrogen of the first layer and a concentration of hydrogen of the second gate insulating film.

13. The device according to claim 8, wherein the second layer is continuous with the second gate insulating film.

14. The device according to claim 13, wherein
    the first layer includes silicon nitride film,
    the second layer includes silicon oxide film, and
    the second gate insulating film includes silicon oxide film.

15. The device according to claim 13, wherein a concentration of hydrogen of the first layer is higher than a concentration of hydrogen of the second layer and a concentration of hydrogen of the second gate insulating film.

16. The device according to claim 1, wherein the first semiconductor layer and the second semiconductor layer include an oxide including indium and at least one of gallium, zinc, tin, and silicon.

17. The device according to claim 1, wherein
the first transistor further includes a first channel protective film,
the first gate insulating film is provided on the first gate electrode,
the first semiconductor layer is provided on the first gate insulating film,
the first channel protective film is provided on the third portion,
the first conductive unit is provided on at least the first portion,
the second conductive unit is provided on at least the second portion,
the second transistor further includes a second channel protective film,
the second gate insulating film is provided on the second gate electrode,
the second semiconductor layer is provided on the second gate insulating film,
the second channel protective film is provided on the sixth portion,
the third conductive unit is provided on at least the fifth portion, and
the fourth conductive unit is provided on at least the sixth portion.

18. The device according to claim 1, wherein
the first gate insulating film is provided on the first semiconductor layer,
the first gate electrode is provided on the first gate insulating film,
the first conductive unit is provided on the first portion,
the second conductive unit is provided on the second portion,
the second gate insulating film is provided on the second semiconductor layer,
the second gate electrode is provided on the second gate insulating film,
the third conductive unit is provided on the fourth portion, and
the fourth conductive unit is provided on the fifth portion.

19. The device according to claim 18, further comprising:
a protective layer provided on the first gate insulating film and on the second gate insulating film,
wherein each of the first conductive unit, the second conductive unit, the third conductive unit, and the fourth conductive unit is provided on the protective layer.

20. A semiconductor device comprising:
a first transistor including:
    a first semiconductor layer including a first portion, a second portion, and a third portion provided between the first portion and the second portion;
    a first conductive unit electrically connected to the first portion;
    a second conductive unit separated from the first conductive unit and electrically connected to the second portion;
    a first gate electrode separated from the first conductive unit, the second conductive unit, and the first semiconductor layer, and the first gate electrode opposing the third portion; and
    a first gate insulating film provided between the third portion and the first gate electrode; and
a second transistor including:
    a second semiconductor layer including a fourth portion, a fifth portion, and a sixth portion provided between the fourth portion and the fifth portion;
    a third conductive unit electrically connected to one of the first conductive unit, the second conductive unit, and the first gate electrode and electrically connected to the fourth portion;
    a fourth conductive unit separated from the third conductive unit and electrically connected to the fifth portion;
    a second gate electrode separated from the third conductive unit, the fourth conductive unit, and the second semiconductor layer, and the second gate electrode opposing the sixth portion; and
    a second gate insulating film provided between the sixth portion and the second gate electrode,
an amount of hydrogen included in the first gate insulating film being larger than an amount of hydrogen included in the second gate insulating film.

* * * * *